United States Patent
Wang et al.

[11] Patent Number: 5,999,718
[45] Date of Patent: Dec. 7, 1999

[54] LINEARIZER METHOD AND APPARATUS

[75] Inventors: Wei-Chun Wang, Temple City; Arnold L. Berman; Michael I. Mandell, both of Los Angeles; Tong-Jyh Lee, Hermosa Beach, all of Calif.

[73] Assignee: Hughes Electronics Corporation, Los Angeles, Calif.

[21] Appl. No.: 09/025,763

[22] Filed: Feb. 18, 1998

[51] Int. Cl.⁶ ........................................ G06F 17/50
[52] U.S. Cl. ........................ 395/500.23; 395/500.34
[58] Field of Search ............................ 364/578, 488, 364/489, 490; 395/500.23, 500.34, 500.35; 455/126, 115, 116; 330/129, 279, 149; 708/322

[56] References Cited

U.S. PATENT DOCUMENTS

| | | | |
|---|---|---|---|
| 5,051,911 | 9/1991 | Kimura et al. | 364/468 |
| 5,057,992 | 10/1991 | Traiger | 364/148 |
| 5,313,398 | 5/1994 | Rohrer et al. | 364/468 |
| 5,467,291 | 11/1995 | Fan et al. | 364/578 |
| 5,663,890 | 9/1997 | Saleh et al. | 364/490 |
| 5,689,685 | 11/1997 | Feldmann et al. | 395/500 |
| 5,838,947 | 11/1998 | Sarin | 395/500 |

Primary Examiner—Kevin J. Teska
Assistant Examiner—Thai Phan
Attorney, Agent, or Firm—Terje Gudmestad; Georgann Grunebach; Michael W. Sales

[57] ABSTRACT

An automatic and iterative simulation method for adjusting linearizer parameters to achieve desired AM/AM and AM/PM characteristics is disclosed. The disclosed method includes the steps of choosing a set of linearizer parameters, modeling the performance of the linearizer circuit and the power amplifier to calculate a performance index. The performance index is compared to a threshold. The method continues to iterate until the performance index is acceptable in comparison to the threshold. When the process is completed, the linearizer parameters are output for use by the designer. The disclosed method eliminates the need to engage in trial and error methods in a laboratory when combining a linearizer and a power amplifier to produce linear output characteristics.

11 Claims, 2 Drawing Sheets

LINEARIZER METHOD AND APPARATUS

APPENDIX

Source code for the present invention written in the language C is included as Appendix A, available in file and will not be printed in patent literature.

BACKGROUND OF THE INVENTION (a) Field of the Invention

The present invention relates to linearizers that are used in communication systems and, more particularly, to a method of designing linearizers.

(b) Description of Related Art

Communication systems utilize a wide range of transmission equipment for establishing communication links. Specifically, most communication systems utilize power amplifiers to boost a signal to an acceptable power level for transmission. Communication systems use a broad array of amplifiers including tube amplifiers and transistor amplifiers. Each particular amplifier has unique gain and phase distortion characteristics. The gain of an amplifier is defined as the ratio of the output power to the input power. The gain of an amplifier may be plotted as output power against input power. The gain of an amplifier is typically linear at low input powers, but non-linear as the input signal power is increased. As the input power increases, the amplifier is operated close to saturation and the gain of the amplifier begins to fall off. A criteria for defining the gain performance of an amplifier is through the use of the amplitude modulation to amplitude modulation (AM/AM) conversion coefficient. The AM/AM conversion coefficient measures the slope of an amplifier's gain plot. As the input signal to the amplifier gets larger (i.e., the amplifier is operated closer to saturation) the AM/AM conversion coefficient becomes smaller.

Another criteria for defining amplifier performance is by measuring the phase differential between the input and the output of an amplifier. The phase differential of an amplifier is typically plotted against input power supplied to the amplifier. At low input power levels, the phase differential of an amplifier may be constant. However, as the amplifier input becomes larger and as the amplifier operates closer to its saturation point the phase differential typically becomes non-linear. A standard measure of phase differential against input power is the amplitude modulation to phase modulation (AM/PM) conversion coefficient. The AM/PM conversion coefficient is the slope of the relative phase against the input power supplied to the amplifier. The AM/PM conversion coefficient is typically constant at low amplifier input power and increases with an increase in input power.

It is desirable to eliminate or minimize the non-linear characteristics of an amplifier. Elimination of the non-linear characteristics allows an amplifier to operate close to its saturation point, which yields cost, power consumption, and size reductions in amplifier circuitry. The use of a linearizer to minimize the non-linear effects of an amplifier is known. A linearizer is typically located in an amplifier lineup before, or combined with, a preamplifier. The linearizer produces amplitude and phase distortion of the input signal in order to compensate for the non-linear characteristics of the power amplifier. That is, the linearizer and the amplifier, when cascaded, produce a linear output characteristic.

Traditionally, the design of a linearizer/amplifier system has been done manually. That is, linearizer parameters (e.g., resistance, capacitance, and gain) were adjusted and the linearizer/amplifier characteristics (e.g., AM/AM and AM/PM) were monitored either using software simulations or laboratory measurements. After several iterations of the tuning process on a parameter, it is usually up to the discretion of the designer whether to keep adjusting the same parameter or switch to the next parameter. This iterative and indefinite process is very time consuming and satisfactory results are not guaranteed. If a microstrip linearizer is being analyzed, the tuning and adjustment of linearizer parameters is very difficult and inaccurate. It would be desirable to have an automatic and iterative simulation method for adjusting linearizer parameters to achieve desired AM/AM and AM/PM characteristics without the need to engage in trial and error methods in a laboratory.

SUMMARY OF THE INVENTION

The present invention is an automatic and iterative simulation method for adjusting linearizer parameters to achieve desired AM/AM and AM/PM characteristics. This method eliminates the need to engage in trial and error methods in a laboratory when combining a linearizer and a power amplifier to produce linear output characteristics. The method includes the steps of choosing a set of linearizer parameters, and modeling the performance of the linearizer circuit and the power amplifier to calculate a performance index. The performance index is continuously compared to a threshold until the performance index is acceptable in comparison to the threshold. When the process is completed, the linearizer parameters are output for use by the designer.

The invention itself, together with further objects and attendant advantages, will best be understood by reference to the following detailed description, taken in conjunction with the accompanying drawings.

DESCRIPTION OF THE PREFERRED EMBODIMENTS

The present invention is an automatic and iterative simulation method for adjusting linearizer parameters to achieve desired AM/AM and AM/PM characteristics. This method eliminates the need to engage in trial and error methods in a laboratory when combining a linearizer and a power amplifier to produce linear output characteristics.

Figure 1:
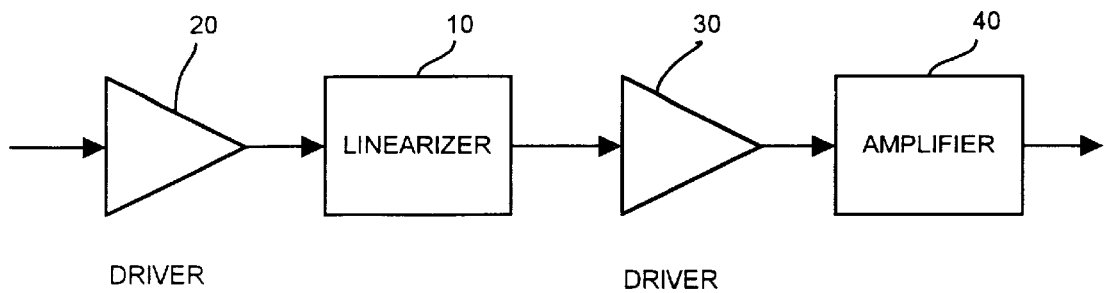
FIG. 1 is a diagram illustrating a linearizer circuit with an amplifier circuit and two driver circuits.

Referring now to FIG. 1, a circuit diagram illustrates a linearizer 10, a first driver 20, a second driver 30, and an amplifier 40. The simulation method and apparatus of the present invention may be applied to the linearizer 10 in conjunction with the drivers 20, 30 to linearize the characteristics of the amplifier 40.

Figure 2:
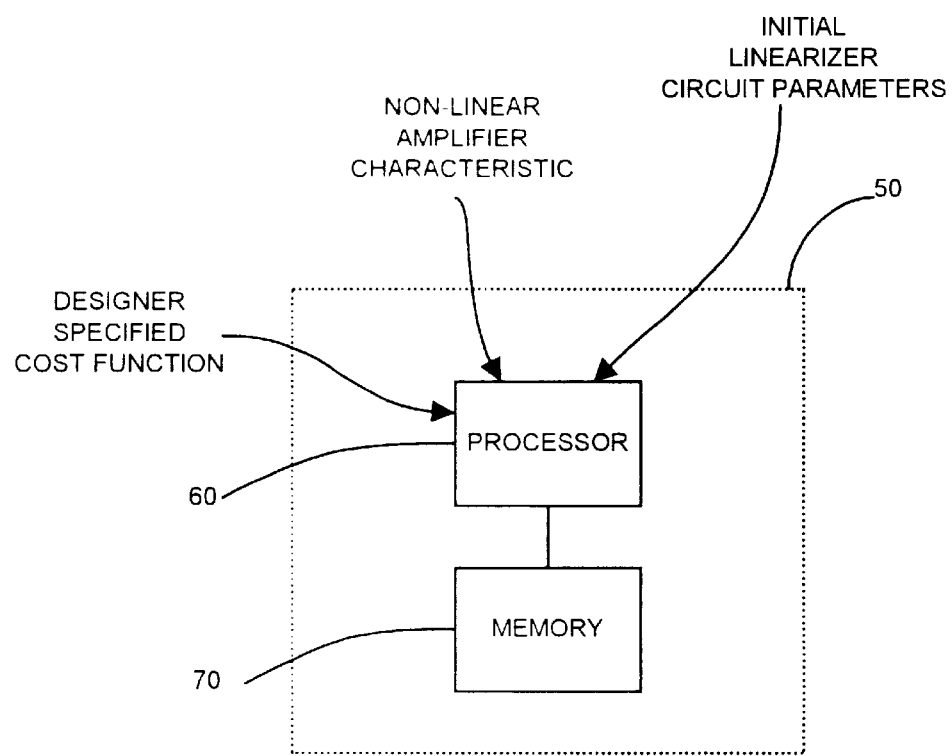
FIG. 2 is a diagram of a system capable of implementing the present invention.

FIG. 2 is a diagram of a system capable of carrying out the simulation steps of the present invention. A computer 50 is shown having multiple inputs and a single output. The inputs to the computer 50 include non-linear amplifier characteristics, a designer specified cost function, and initial linearizer circuit parameters. The computer 50 includes a processor 60 and a memory 70. The processor 60 is programmed to interact with the memory 70 to execute program instructions stored in the memory 70. The memory 70 is programmed to implement the method of the present invention, whereby the input information is processed to produce optimized linearizer circuit parameters.

Figure 3:
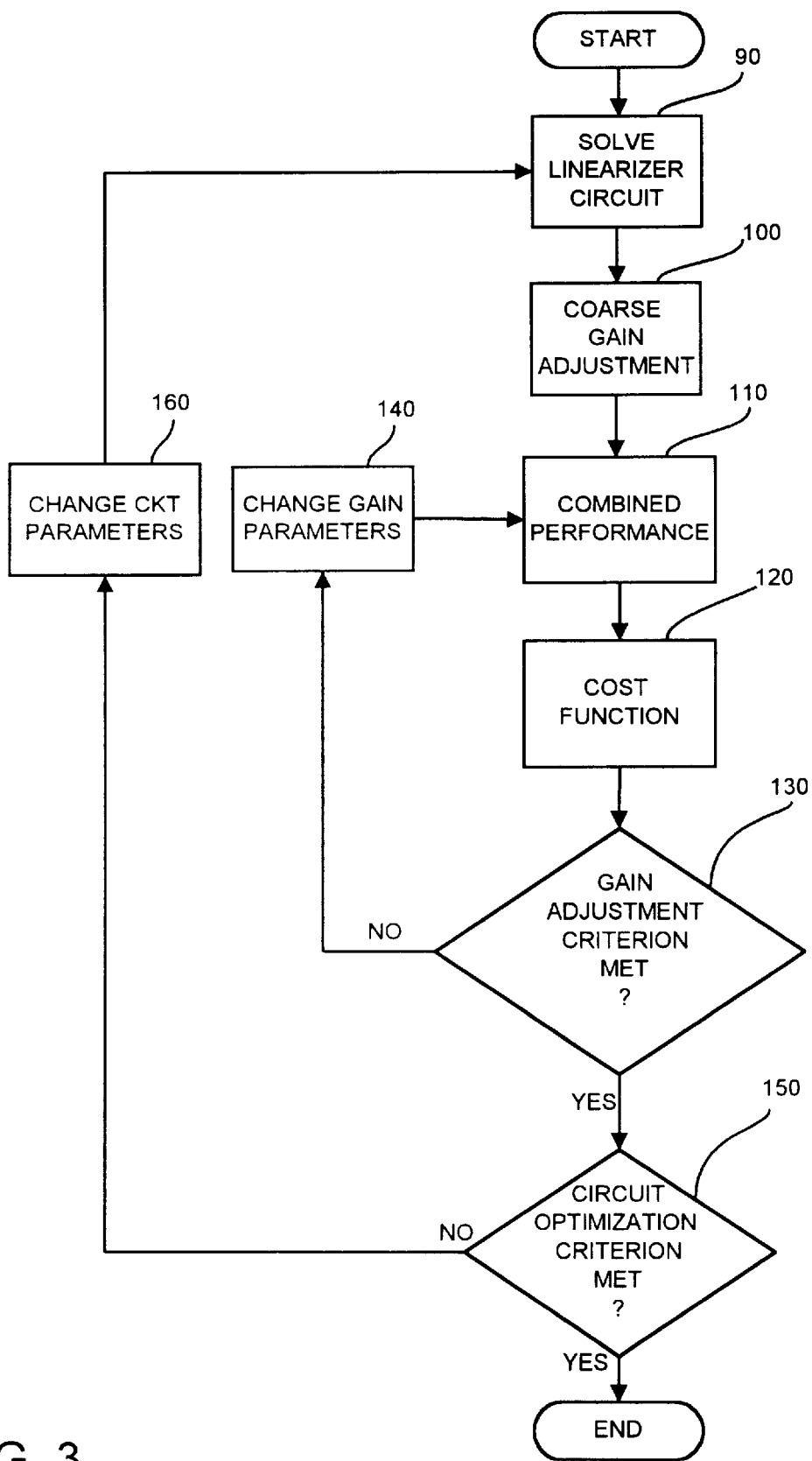
FIG. 3 is a diagram illustrating the method of the present invention.

FIG. 3 is a flow diagram representing the method of the present invention. Software instructions representing this method are programmed into the memory 70 and executed by the processor 60 in a desired manner. When the method begins, a block 90 solves the linearizer circuit. This is done using the linearizer circuit parameters and the desired linearizer AM/AM and AM/PM characteristics derived from the amplifier non-linear characteristics. Block 90 employs Newton's method to solve for the fundamental and harmonic voltage components across the linear/non-linear boundary of the circuit. Preferably, twelve harmonics are used to provide stable solutions with reasonable running times. The solver block 90 generates a set of AM/AM and AM/PM characteristics as a result of iterative harmonic balancing runs.

After the linearizer circuit is solved, a block 100 begins a gain adjustment function. The gain adjustment function, which includes blocks 100–140, is designed to optimally match the linearizer characteristics with a set of target characteristics. Target characteristics are derived from the amplifier characteristics so that, in combination with the amplifier, the overall AM/AM characteristic is perfectly linear up to the maximum power of the amplifier. Likewise, the circuit is solved to have an AM/PM characteristic equal to zero degrees across the full input range. The parameters optimized in this procedure are the pre and post linearizer gains 20, 30, as shown in FIG. 1. The gains 20, 30 are realized using adjustable attenuators.

The gain adjustment procedure is carried out in a coarse adjustment step and a fine adjustment step. Coarse alignment of the linearizer and the amplifier is done in the coarse gain adjustment block 100 by selecting several points from the desired and calculated AM/AM and AM/PM curves. The desired curves are the target curves derived from the amplifier characteristics and the calculated curves are from circuit solver runs. Gain adjustments are calculated so that the square distance sum of these points is a minimum. These points represent the beginning of the gain expansion and phase compensation. Preferably, 1 dB of gain expansion and 10° of phase compensation are used as center points. Two other points are then selected on either side of the center point for the minimization.

After the coarse adjustment step is completed by block 100, a fine adjustment process is started. The fine adjustment process consists of blocks 110–140. A cost function 120 is determined by a user input to the method. Additionally, some optimization boundaries can be set by the user to force an acceptable and practical solution. These boundaries are set by assigning very high cost values in the optimizer. It should be noted that it is crucial for initial gain values to fall within the user defined boundaries, otherwise Powell's algorithm may not return valid solutions.

The fine alignment process begins with the coarse results of block 100 and employs Powell's algorithm, which is a well known optimization routine. A block 110 then calculates the combined performance of the linearizer circuit and the amplifier. The characteristics of both the amplifier and the linearizer are combined to determine system AM/AM and AM/PM performance. After the combined performance is calculated, a block 130 determines if the gain adjustment optimization criteria is met. The optimization criteria is determined to be met if the optimizer is making less progress than specified by the user in block 120. That is, block 130 determines if the is the results of the optimizer are progressing in a manner acceptable in relation to the performance criteria specified by the user. If the optimization criteria is not met, control is passed to a block 140, which changes the gain parameters. The gain parameters are changed according to Powell's algorithm and user specified constraints. Specifically, gain parameters are determined by evaluating the combined performance of the linearizer and the amplifier as determined by block 110. After block 140 changes the gain parameters control is returned to block 100 to close an inner loop. If the optimization criteria is met, control is passed to a block 150.

A block 150 checks to see if the cost function is progressing acceptably in relation to the user specified value. If the cost function is not progressing acceptably, the circuit optimization criteria is met and the method ends. Otherwise, control is passed to block 160, which chooses a new set of circuit parameters according to Powell's algorithm and the user-entered constrains. The new set of parameters are input to the circuit solver to calculate the corresponding linearizer characteristics and restart the fine and coarse optimization loops.

It is worth noting that a user of the present invention may select the performance criteria used by the method. Specifically, circuit performance may be evaluated in terms of circuit cost improvement, circuit performance, or circuit performance improvement. Blocks 130 and 150 stop execution of the method when the calculated index is above or below a user-set threshold. That is, blocks 130 and 150 check to determine if the calculated index is acceptable in relation to the user-set threshold.

The inner loop is responsible for gain adjustment and the outer loop is responsible for circuit parameter adjustments. Both the outer loop and the inner loop employ Powell's algorithm, which is well known in the art. Some additional constraints of the method can be set by the designer. Specifically, the designer may instruct the optimizer to change optimization direction when the calculated characteristics are judged unacceptable. This is done by assigning an extraordinarily large cost to the current set of circuit parameters.

Of course, it should be understood that a range of changes and modifications can be made to the preferred embodiment described above. For example, instead of running the algorithm once from a single starting point, the algorithm may be run multiple times from a variety of starting points. After the algorithm has been run multiple times the best result from the runs may be selected as the result of the algorithm. This approach reduces the effects of initial-parameter sensitivity, which are well known.

It is therefore intended that the foregoing detailed description be regarded as illustrative rather than limiting and that it be understood that it is the following claims, including all equivalents, which are intended to define the scope of this invention.

What is claimed is:

1. A method of calculating a set of linearizer parameters for use in a linearizer circuit such that when said linearizer circuit is combined with a power amplifier a response of the combination is linear, the steps comprising:
   a. choosing a set of linearizer parameters;
   b. modeling the combination of the linearizer circuit and the power amplifier to calculate a performance index;
   c. comparing said performance index to a threshold performance index;
   d. iterating steps a–c until said performance index is acceptable in comparison to said threshold performance index; and e. outputting said set of linearizer parameters when said performance index is acceptable in comparison to said threshold performance index.

2. The method of claim 1, wherein said set of linearizer parameters comprises resistors, capacitors, inductors, and gain.

3. The method of claim 1, wherein said performance index is based on an improvement in circuit performance.

4. The method of claim 1, wherein said performance index is based on an improvement in cost performance.

5. The method of claim 1, wherein said performance index is based on cost performance.

6. The method of claim 1, wherein said performance index is based on circuit performance.

7. The method of claim 1 wherein, said threshold performance index is based on an improvement in circuit performance.

8. The method of claim 1 wherein, said threshold performance index is based on an improvement in cost performance.

9. The method of claim 1 wherein, said threshold performance index is based on cost performance.

10. The method of claim 1 wherein, said threshold performance index is based on circuit performance.

11. An apparatus for calculating a set of linearizer parameters for use in a linearizer circuit for combination with a power amplifier comprising:

a computer comprising a processor and a memory;

said processor programmed to interact with said memory to perform instructions stored in said memory;

when executed, said instructions perform the following steps:

a. choose a set of linearizer parameters;

b. model the combination of the linearizer circuit and the power amplifier to calculate a performance index;

c. compare said performance index to a threshold performance index;

d. iterate steps a–c until said performance index is acceptable in comparison to said threshold performance index; and e. output said set of linearizer parameters when said performance index is acceptable in comparison to said threshold performance index.

* * * * *